United States Patent
Amjhera Wala et al.

(10) Patent No.: US 11,540,384 B2
(45) Date of Patent: Dec. 27, 2022

(54) COMPACT ULTRASOUND IMAGING APPARATUS

(71) Applicant: TEXAS INSTRUMENTS INCORPORATED, Dallas, TX (US)

(72) Inventors: Shabbir Amjhera Wala, Bengaluru (IN); Xiaochen Xu, Coppell, TX (US); Dijeesh K, Bengaluru (IN); Abhishek Vishwa, Bengaluru (IN); Shriram Devi, Pune (IN); Aatish Chandak, Bengaluru (IN); Sanjay Dixit, Faridabad (IN); Elisa Maddalena Granata, Milan (IT); Jun Shen, Shenzhen (CN); Sandeep Oswal, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 312 days.

(21) Appl. No.: 17/014,143

(22) Filed: Sep. 8, 2020

(65) Prior Publication Data
US 2021/0329776 A1 Oct. 21, 2021

Related U.S. Application Data

(60) Provisional application No. 63/010,320, filed on Apr. 15, 2020.

(51) Int. Cl.
*H05K 1/00* (2006.01)
*H05K 1/02* (2006.01)
*H04B 1/40* (2015.01)

(52) U.S. Cl.
CPC ............. *H05K 1/0243* (2013.01); *H04B 1/40* (2013.01)

(58) Field of Classification Search
CPC ................................ H05K 1/0243; H04B 1/40
See application file for complete search history.

(56) References Cited

U.S. PATENT DOCUMENTS

| | | | |
|---|---|---|---|
| 2014/0264331 A1* | 9/2014 | Yao | H01L 22/32 438/15 |
| 2015/0036728 A1* | 2/2015 | Nguyen | H04B 7/08 375/222 |
| 2016/0013923 A1* | 1/2016 | Malaga | G01S 7/034 370/277 |

OTHER PUBLICATIONS

Texas Instruments. "Highly Integrated Signal Chain Solutions TX7332 and AFE5832LP for Smart Ultrasound Probes." Application Report, SBOA361—Jul. 2019. pp. 1-9.

* cited by examiner

*Primary Examiner* — Pete T Lee
(74) *Attorney, Agent, or Firm* — John R. Pessetto; Frank D. Cimino

(57) ABSTRACT

An apparatus comprises a transceiver (Tx/Rx) printed circuit board (PCB) with a top surface and a bottom surface and a power supply PCB. The Tx/Rx PCB includes two transmitter devices, each comprising a number N of channels. A first transmitter device is arranged on the bottom surface and a second transmitter device is arranged on the top surface over the first transmitter device. One or more pins of the second transmitter device are shorted with one or more pins of the first transmitter device with the same function. An analog front end (AFE) device comprising N input channels is arranged on the top surface of the Tx/Rx PCB, and a digital signal processor is coupled to the AFE device. The power supply PCB comprises a power supply module configured to provide a plurality of supply voltages to the Tx/Rx PCB and the power supply PCB.

20 Claims, 9 Drawing Sheets

COMPACT ULTRASOUND IMAGING APPARATUS

CROSS REFERENCE TO RELATED APPLICATION

This application claims priority to U.S. Provisional Application 63/010,320, filed Apr. 15, 2020, titled "Ultraportable Ultrasound Imaging Apparatus and Methods for Supporting Covid-19 Diagnosis," which is hereby incorporated by reference in its entirety.

BACKGROUND

Image quality in ultrasound systems is correlated with the number of signal channels: higher channel count corresponds to better image quality, and vice versa. Larger, cart-based ultrasound systems can implement large numbers of channels without concern for the associated high power usage and large system area and volume. However, larger, cart-based ultrasound systems cannot be easily sterilized between patient uses, hindering its use in patient care during pandemics. In addition, a larger number of channels corresponds to a larger supply current, which requires large amounts of power and can introduce ringing in the power supply.

In contrast, hand-held, portable ultrasound systems can be easily sterilized between patient uses, but must be smaller in size and relatively low power, such that the hand-held ultrasound system can be powered using batteries. The smaller size and lower power reduce the number of channels hand-held ultrasound systems can incorporate, which results in poorer image resolution than the larger, cart-based ultrasound systems.

SUMMARY

An apparatus comprises a transceiver (Tx/Rx) printed circuit board (PCB) with a top surface and a bottom surface and a power supply PCB. The Tx/Rx/PCB includes a first transmitter device arranged on the bottom surface and a second transmitter device arranged on the top surface over the first transmitter device, each of which comprise a number N of channels. One or more pins of the second transmitter device are shorted with one or more pins of the first transmitter device with the same function. An analog front end (AFE) device comprising N input channels is coupled to a digital signal processor (DSP). The power supply PCB comprises a power supply module configured to generate a plurality of supply voltages for the Tx/Rx PCB and the power supply PCB.

In some examples, each particular channel of the N channels of the first transmitter device and the N channels of the second transmitter device includes a unique transmit/receive (T/R) switch that is configured to select which of the N channels of the first transmitter device and which of the N channels of the second transmitter device to coupled to the N input channels of the AFE device. In some examples, the DSP provides clocking signals to the first and second transmitter devices and to the AFE device and transitions the clocking signals to a tri-state mode of operation while the first and second transmitter devices are inactive.

In some examples, the power supply module comprises a first sub-module and a second sub-module on a top surface of the power supply PCB and a third sub-module on a bottom surface of the power supply PCB. The first sub-module is configured to provide a first power supply to the AFE device and the DSP. The second sub-module is configured to provide a second power supply to a peripheral controller and an output interface affixed on the top surface of the power supply PCB. The third sub-module is configured to provide a third power supply to the first and second transmitter devices. In some examples, the power supply PCB is arranged under the Tx/Rx PCB such that the third sub-module is under the first and second transmitter devices.

In some implementations, the third sub-module includes a filter comprising a transistor and a low-pass filter. The transistor includes a control terminal, and first and second current terminals. The first current terminal is configured to receive the third power supply and the second current terminal is configured to provide a filtered, third power supply. The low pass filter has an input configured to receive the third power supply and an output coupled to the control terminal of the transistor. The Tx/Rx PCB can further include a set of high-voltage supply capacitors arranged on the top and bottom surfaces of the Tx/Rx PCB, and the second layer of the Tx/Rx PCB can be a high-voltage supply local plane arranged under the set of high-voltage supply capacitors.

BRIEF DESCRIPTION OF THE DRAWINGS

For a detailed description of various examples, reference will now be made to the accompanying drawings in which.

DETAILED DESCRIPTION

The disclosed ultrasound device incorporates more channels in a smaller volume using less power by placing two transmitter devices on opposite sides of a transceiver PCB and shorting pins with similar functions together. The transmit/receive switches in the channels of the two transmitter devices can be used to select which channels to transmit and receive signals from, such that the signals from two channels with channel output pins shorted together are not compromised. Shorting the power supply pins and receive pins of the two transmitter devices together reduces the number of blind vias needed and conserves area on the transceiver PCB. The transceiver PCB also includes an analog front end device and a digital signal processor to perform beamforming and beam steering operations on the received signals and form an ultrasound image.

A power supply PCB includes a power supply module configured to provide a variety of different supply voltages to different devices on the transceiver PCB. The power supply PCB is arranged underneath the transceiver PCB such that a high-voltage power sub-module configured to provide a large supply voltage for the transmitter devices is aligned underneath them. A set of high-voltage supply capacitors are arranged on the top and bottom surfaces of the transceiver PCB near the transmitter devices, and a high-voltage supply local plane in the second layer of the transceiver PCB is aligned underneath the high-voltage supply capacitors to reduce supply plane parasitic inductance between the transmitter devices and the high-voltage supply capacitors.

Figure 1:
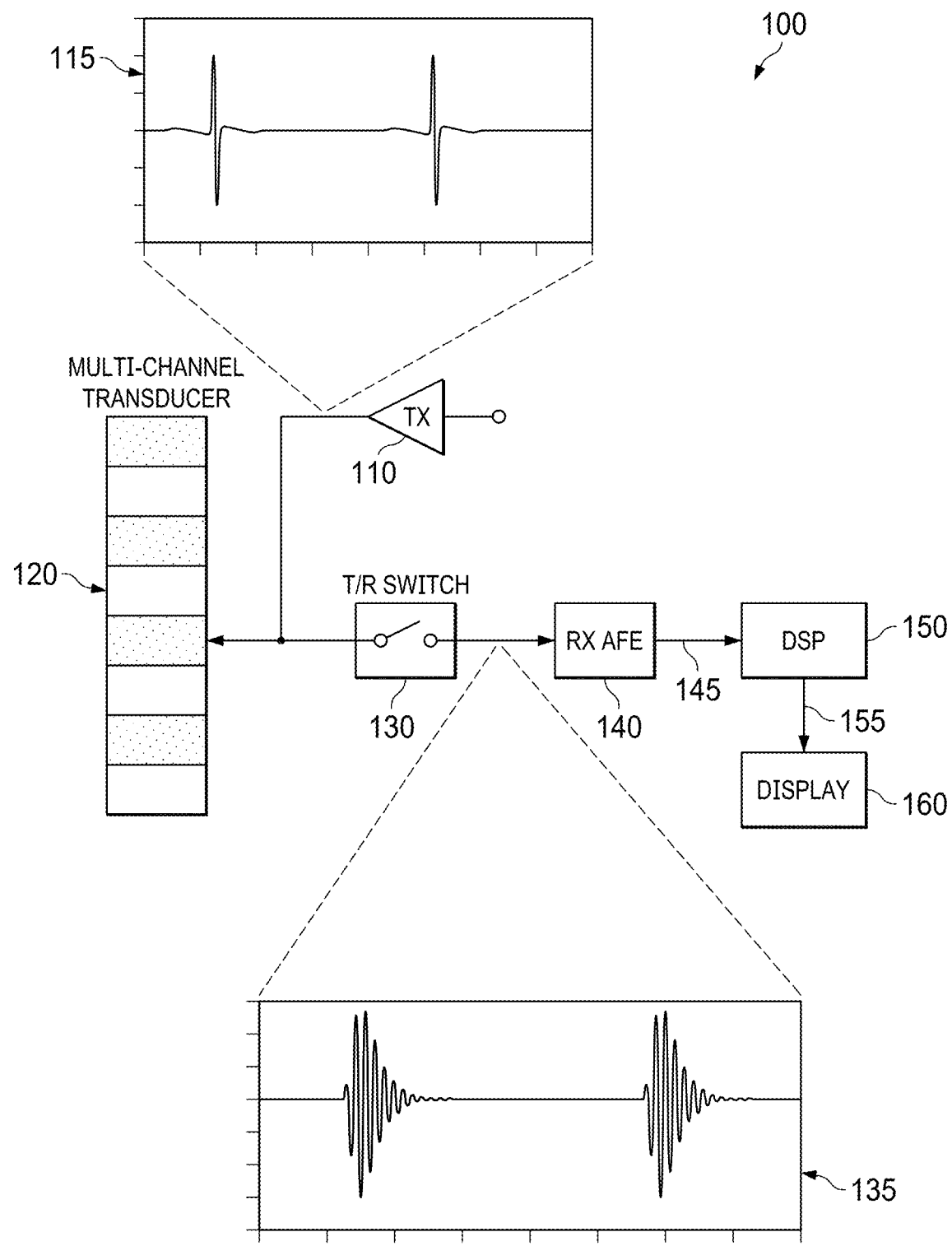
FIG. 1 illustrates a simplified block diagram of an example ultrasound system.

FIG. 1 illustrates a simplified block diagram of an example ultrasound system 100, which includes a transmitter (Tx) 110, a multi-channel transducer 120, a transmit/receive (T/R) switch 130, a receiver (Rx) analog front end (AFE) device 140, a digital signal processor (DSP) 150, and a display 160. The Tx 110 outputs a transmitted pulse 115 to the multi-channel transducer 120. The transmitted pulse 115 can be 200 volts (V) peak to peak, high enough voltage to damage the Rx AFE 140. T/R switch 130 is open while Tx 110 outputs the pulse 115, disconnecting Rx AFE 140 from the multi-channel transducer 120 and protecting it from the high voltages.

The multi-channel transducer 120 receives reflections of the transmitted signal and provides them to Rx AFE 140 through closed T/R switch 130. The received pulse 135 is much lower voltage than the transmitted pulse 115. Rx AFE 140 performs one or more signal processing operations such as amplification, filtering, and analog-to-digital conversion on the received pulse 135. The imaging data 145 from Rx AFE 140 is provided to the DSP 150, which produces finalized imaging data 155. DSP 150 provides the finalized imaging data 155 to be presented to a user on display 160.

Figure 2:
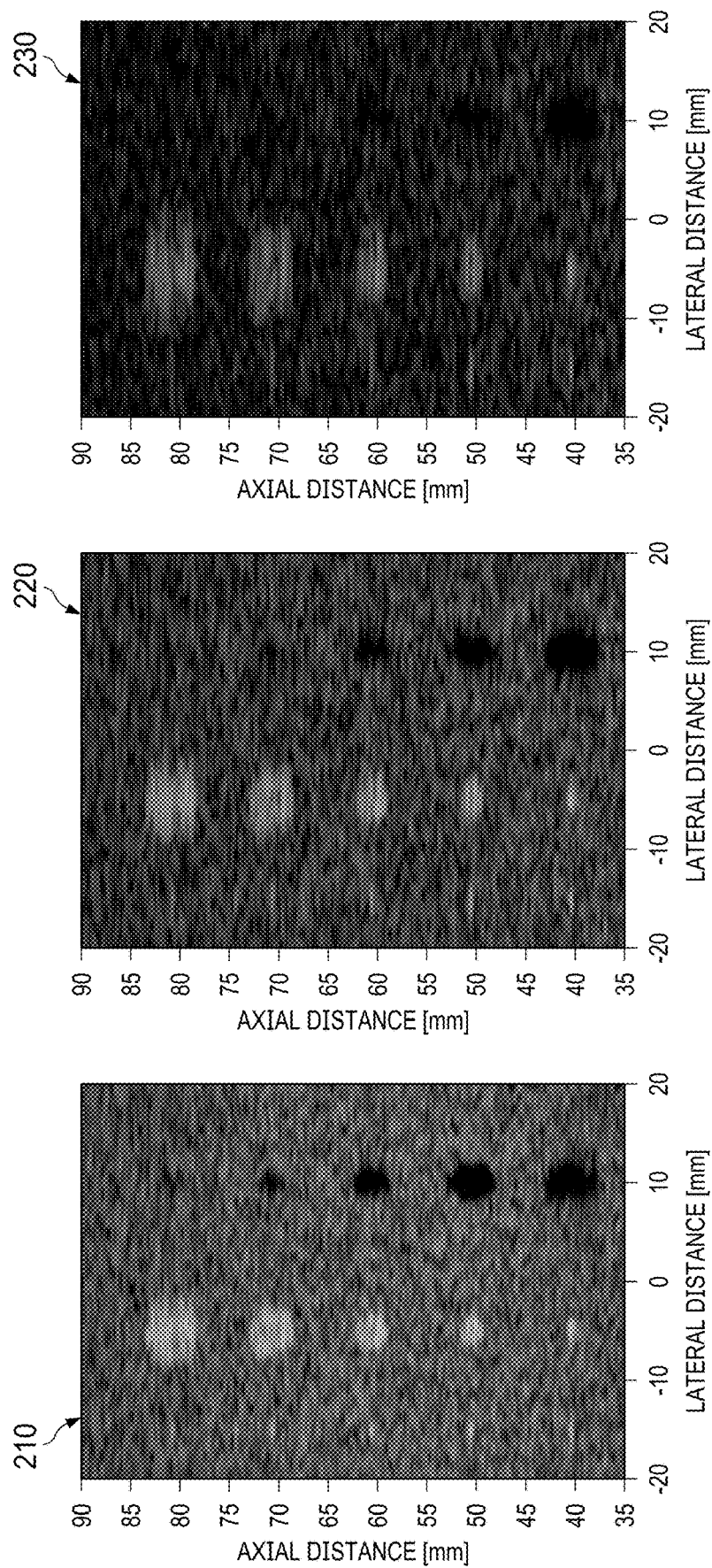
FIG. 2 shows three ultrasound images from ultrasound systems with different numbers of channels.

FIG. 2 shows three ultrasound images from ultrasound systems with different numbers of channels. The image 210 was produced by an ultrasound system with 64 channels and has the best resolution of the three images. The image 220 was produced by an ultrasound system with only 32 channels and has poorer resolution than image 210. The image 230 was produced by an ultrasound system with only 16 channels and has the worst resolution of the three images. Larger, cart-based ultrasound systems can implement large numbers of channels without concern for the associated high power usage and large system area and volume, but cannot be sterilized easily between patient uses. In contrast, handheld, portable ultrasounds are easily sterilized between patient uses, but must be smaller in size and relatively low power, reducing the number of channels that can be implemented.

Figure 3A:
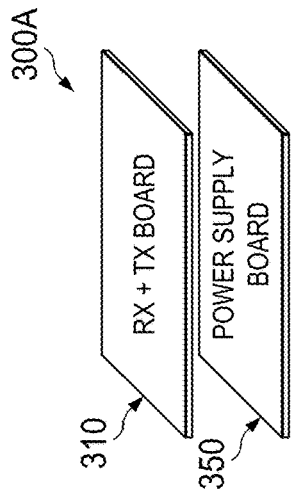
FIGS. 3A-B illustrate block diagrams of an example ultrasound system implemented on two printed circuit boards (PCBs).
Figure 3B:
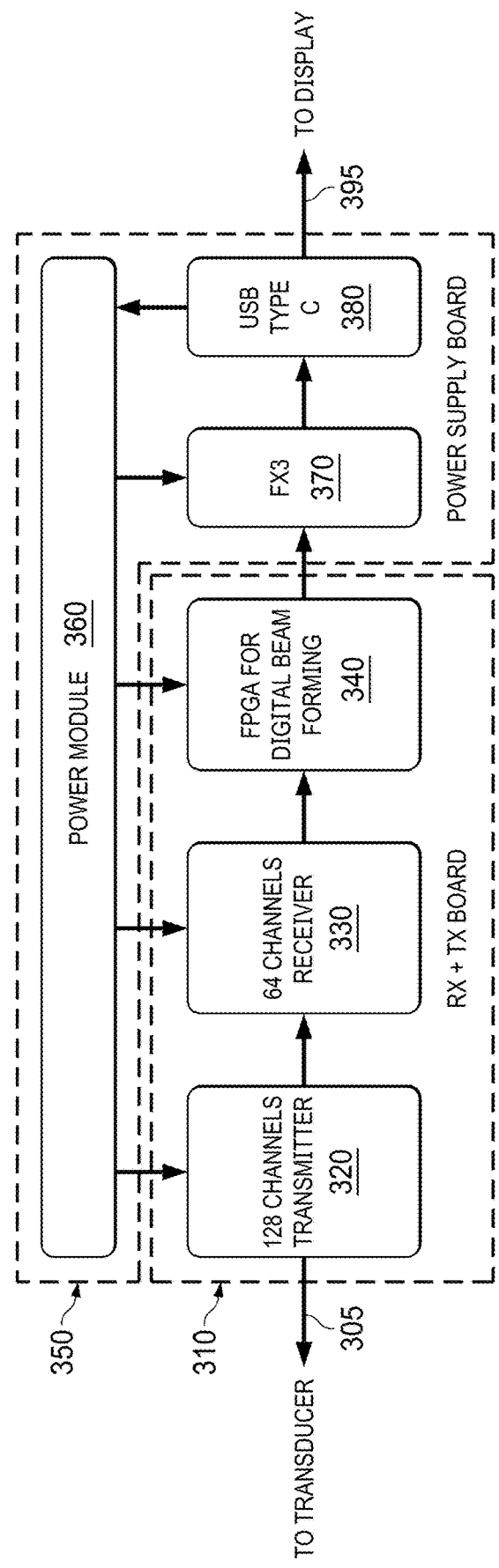

FIGS. 3A-B illustrate block diagrams of an example ultrasound system 300 implemented on two printed circuit boards (PCBs). FIG. 3A shows an expanded view 300A of two PCBs stacked together to reduce the size of the ultrasound system 300. A first PCB board 310 for the transmitters and receivers in the ultrasound system 300 is stacked over a second PCB board 350 for the power supply and management system of the ultrasound system 300.

FIG. 3B shows a block diagram of the ultrasound system 300. The Rx/Tx board 310 includes a transmitter module 320 with 128 transmitter channels, an Rx AFE 330 with 64 channels, and a DSP 340. The transmitter module 320 can include four transmitter devices, each with 32 channels, and provides signals 305 for transmission to a transducer. The transmitter module 320 provides 64 received reflections of the transmitted signals 305 to the 64 input channels of Rx AFE 330. The Rx AFE 330 can include two Rx AFE devices, each with 32 channels, and provides the imaging data to DSP 340, which can be an FPGA with digital beam forming capabilities.

In some examples, DSP 340 provides clocking signals to transmitter module 320 and Rx AFE 330. In ultrasound systems, the transmitters are active for approximately 1% of each image capture. DSP 340 can conserve power by transitioning the clocking signals for transmitter module 320 to a tri-state mode for the 99% of the image capture during which the transmitter module 320 is not active.

The power supply board 350 includes a power module 360, a peripheral controller 370, and an output interface 380. The power module 360 provides power to the Rx/Tx board 310 and the peripheral controller 370. DSP 340 provides the finalized image data to the peripheral controller 370, which converts the finalized image data into a format output by the output interface 380, for example to a display 395. The output interface 380 can be a universal serial bus, for example. Although the example ultrasound system 300 includes 128 transmitter channels and 64 Rx AFE channels, any number of transmitter channels and Rx AFE channels can be incorporated based on the desired implementation.

Figure 4:
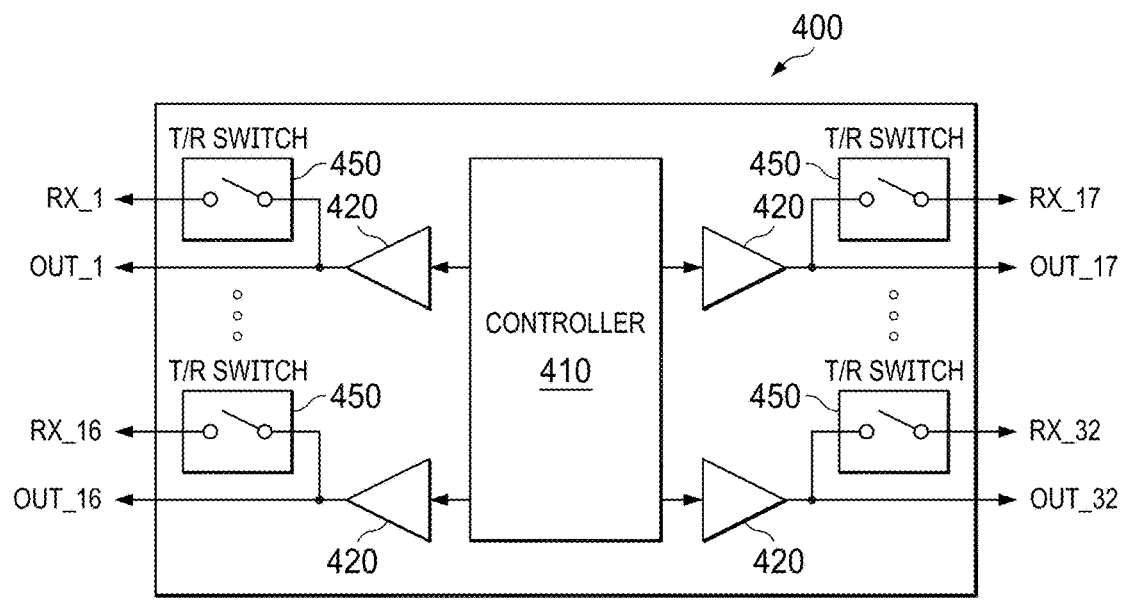
FIG. 4 illustrates a simplified block diagram of an example transmitter device for use in the ultrasound system shown in FIGS. 3A-B.

FIG. 4 illustrates a simplified block diagram of an example transmitter 400 for use in transmitter module 320 of the ultrasound system 300 shown in FIGS. 3A-B. Transmitter 400 includes 32 channels, and transmitter module 320 in ultrasound system 300 can include four transmitter devices 400 to implement the 128 channels. The example transmitter 400 includes a controller 410 to control the 32 channels. Each channel includes a pulser 420 and a transmit/receive (T/R) switch 450. The pulser output is connected to an output pin OUT_N and to one end of T/R switch 450. The other end of the T/R switch 450 is connected to a receiver pin RX_N, where N represents the particular channel number of the 32 channels. Although the example transmitter 400 includes 32 channels, any number of channels can be incorporated based on the desired implementation.

As discussed previously herein with respect to FIG. 1, the T/R switch 450 disconnects the receiver pin RX_N from the pulser 420 while the transmitter pin OUT_N outputs a high voltage signal. After the pulse has been transmitted, the T/R switch 450 closes and connects the receiver pin RX_N to a transducer, such as transducer 120 shown in FIG. 1 to receive the reflected signal. Returning to the example ultrasound system 300 with 128 transmitter channels and 64 Rx AFE channels, the T/R switches 450 in each channel can also be used to select which 64 of the 128 channels to provide to the 64 channel inputs of Rx AFE 330. The T/R switches 450 in the remaining 64 channels can be left open, disconnecting the corresponding receiver output pins from the output of transmitter 400 and the channel inputs of Rx AFE 330.

Figure 5A:
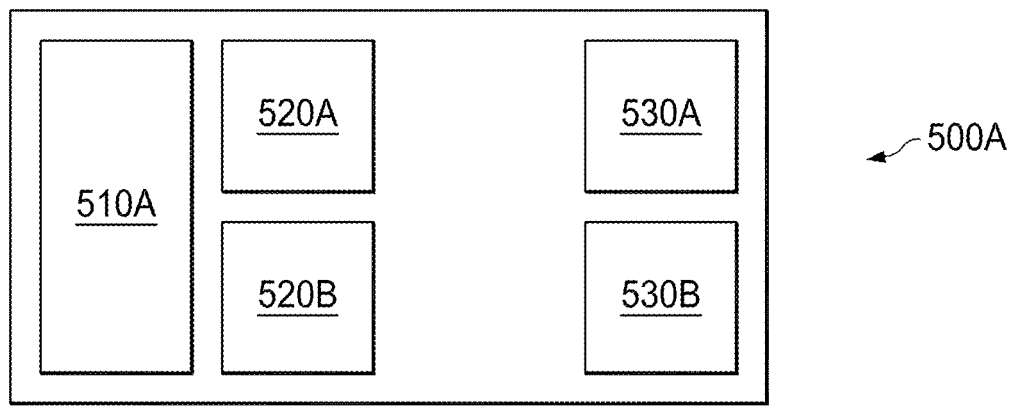
FIGS. 5A-C illustrate simplified block diagrams of an example transmitter and receiver board for use in the ultrasound system shown in FIGS. 3A-B.
Figure 5B:
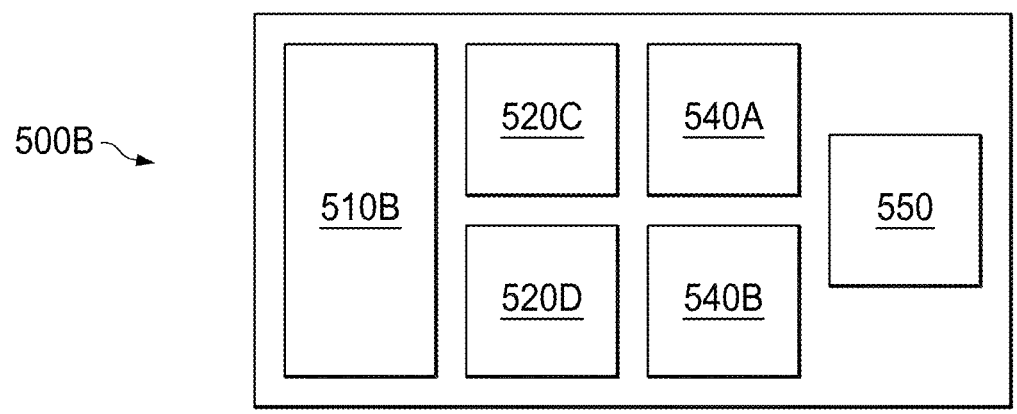
Figure 5C:
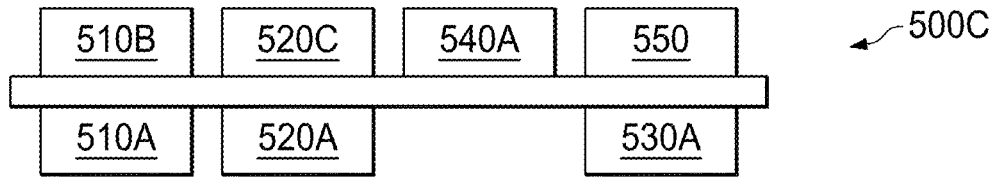

FIGS. 5A-C illustrate simplified block diagrams of an example transmitter and receiver board 500 for use in the ultrasound system 300 shown in FIGS. 3A-B. FIG. 5A illustrates a view 500A of the bottom side of the Rx/Tx board 500, which includes a transducer connector 510A, two 32-channel transmitter devices 520A-B, and power supply connectors 530A-B. Transducer connector 510A receives the signal to be transmitted from transmitters 520A-B and provides it to a multi-channel transducer, such as the multi-channel transducer 120 shown in FIG. 1.

FIG. 5B shows a view 500B of the top side of the Rx/Tx board 500, which includes a transducer connector 510B, two additional 32-channel transmitter devices 520C-D, two 32-channel Rx AFE 540A-B, and a DSP 550. Transmitters 520A-D can each be a transmitter 400 shown in FIG. 4. Although the example Tx/Rx board 500 includes 128 transmitter channels and 64 Rx AFE channels, any number of transmitter channels and Rx AFE channels can be incorporated based on the desired implementation.

FIG. 5C shows a cross-section view 500C of the Rx/Tx board 500, which shows the alignment of transmitter 520C over transmitter 520A. The transmitter 520C is arranged on the top side of the Rx/Tx board 500 over transmitter 520A on the bottom side such that pins with the same function for both transmitters 520A and 520C can be shorted together, reducing the number of traces and the area devoted to them on Rx/Tx board 500. Similarly, transmitter 520D is arranged on the top side of the Rx/Tx board 500 over transmitter 520B on the bottom side such that pins with the same function for both transmitters 520B and 520D can be shorted together. By shorting pins with the same function together, the number of blind vias needed to surround the power supply pins and signal pins can be reduced to half the number otherwise needed for the four transmitters 520A-D.

Figure 6A:
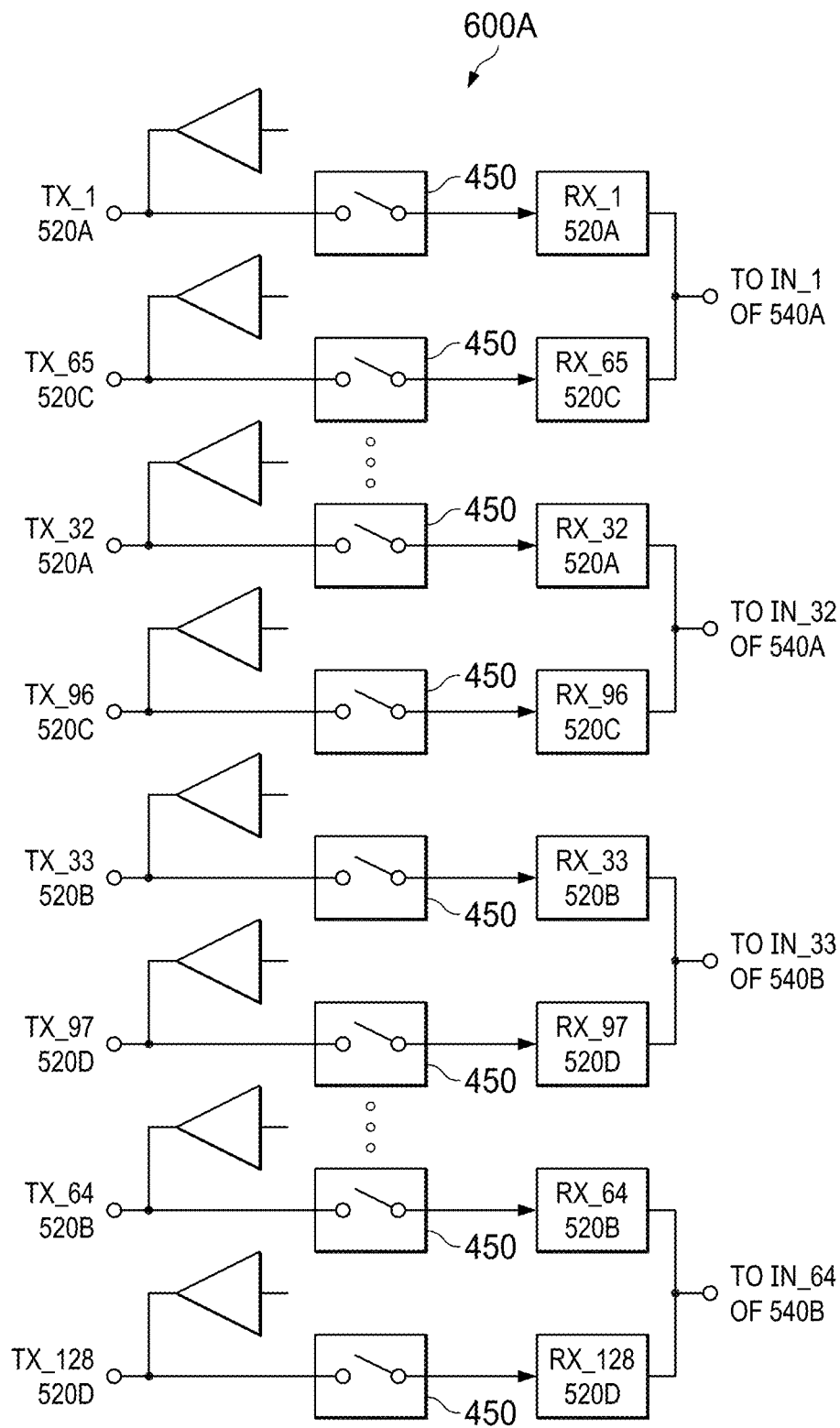
FIGS. 6A-B illustrate example channel mappings for the example transmitter and receiver board shown in FIGS. 5A-C.
Figure 6B:
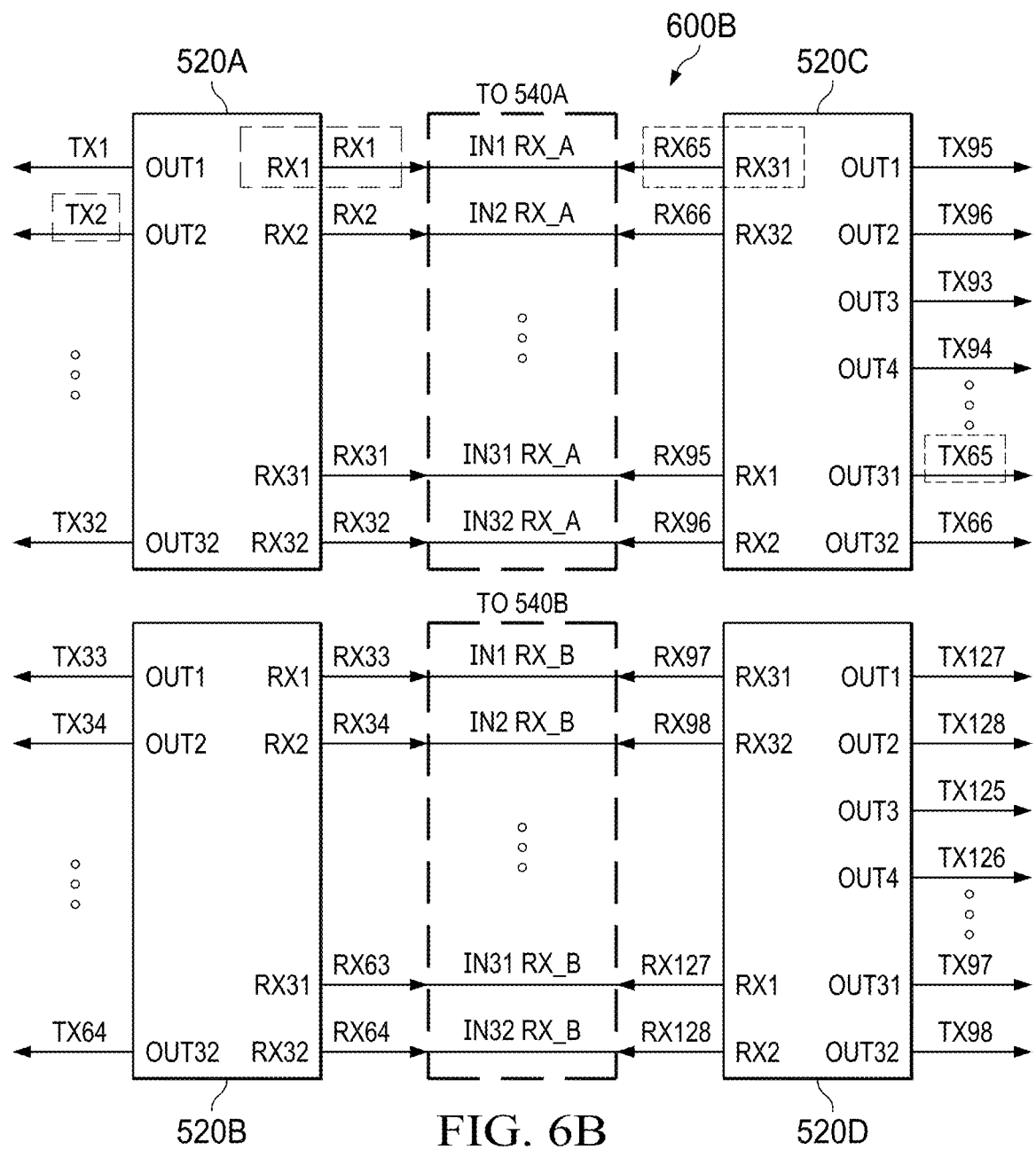

FIGS. 6A-B illustrate example channel mappings for transmitters 520A-D on the Tx/Rx board 500 shown in FIGS. 5A-C. In the simplified block diagram 600A shown in FIG. 6A, channel 1 of transmitter 520A and channel 65 of transmitter 520C can be coupled to the first input IN_1 of Rx AFE 540A. The T/R switches 450 of each channel can be used as a multiplexor for channel selection. While channel 65 is selected, the T/R switch 450 of channel 1 remains open during both signal transmission and receipt. The T/R switch 450 of channel 65 is operates normally while channel 65 is selected. The received signal from RX_65 is provided to input IN_1 of Rx AFE 540A. Thus, the output pins for RX_1 and RX_65 can be shorted together without comprising signal integrity.

Conversely, while channel 1 is selected the T/R switch 450 of channel 65 remains open during both signal transmission and receipt. The T/R switch 450 of channel 1 operates normally while channel 1 is selected. The received signal from RX_1 is provided to input IN_1 of Rx AFE 540A. Each of the remaining channels 2-32 of transmitter 520A and channels 66-96 of transmitter 520C is coupled to the corresponding inputs IN_2 through IN_32 of Rx AFE 540A. Channels 33-64 of transmitter 520B and channels 97-128 of transmitter 520D are similarly configured to inputs IN_33 through IN_64 of Rx AFE 540B, and the corresponding T/R switches 450 operate in a similar manner for channel selection.

FIG. 6B illustrates a simplified block diagram 600B of a channel mapping for the transmitters 520A-D. Instead of sequentially mapping the first channel of transmitter 520A to the first channel of transmitter 520C, the first channel of transmitter 520A is shorted with the $31^{st}$ channel of transmitter 520C. Similarly, the first channel of transmitter 520B is mapped to the $31^{st}$ channel of transmitter 520D. That is, the system-level channel 33, corresponding to the device-level channel 1 of transmitter 520B, is shorted with the system-level channel 97, corresponding to the device-level channel 31 of transmitter 520B.

When the transmitter 520C is flipped and placed atop transmitter 520A, the RX_1 pin of transmitter 520A aligns with the RX_31 pin of transmitter 520C. Similarly, when the transmitter 520D is flipped and placed atop transmitter 520B the RX_1 pin of transmitter 520B aligns with the RX_31 pin of transmitter 520D. Setting the device-level channel 31 of transmitter 520C to be the system-level channel 65 simplifies the channel selection process and allows the RX output pins for transmitters 520A and 520C to be shorted together, reducing the number of blind vias needed and the corresponding manufacturing cost of Rx/Tx board 500.

Figure 7A:
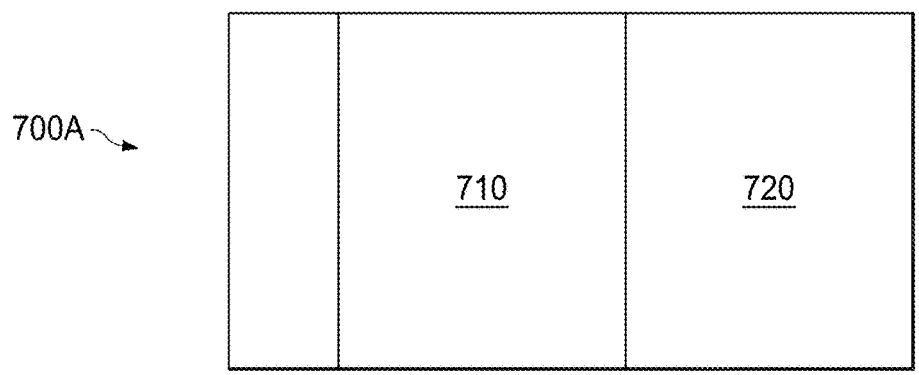
FIGS. 7A-B illustrate simplified block diagrams of an example power supply board for use in the ultrasound system shown in FIGS. 3A-B.
Figure 7B:
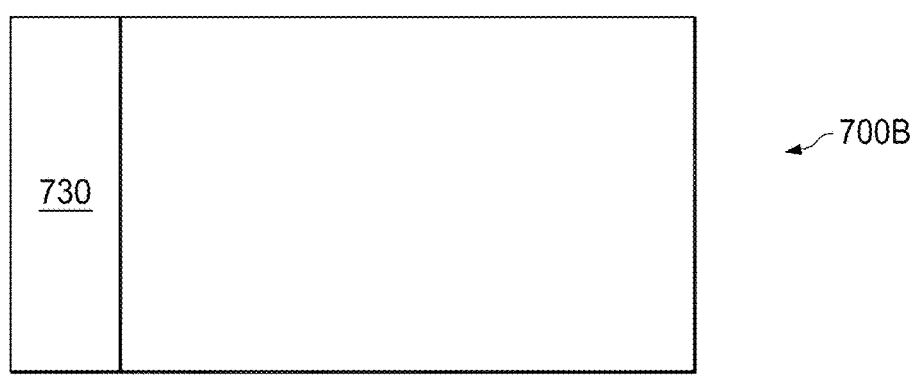

FIGS. 7A-B illustrate simplified block diagrams of an example power supply board 700 for use in the ultrasound system shown in FIGS. 3A-B. FIG. 7A illustrates a top view 700A of the power supply board 700, which includes a first power supply section or sub-module 710 for low voltage power supplies and a second power supply section 720 for the output interface 380. The first power supply section 710 can provide low voltage power supplies to Rx AFE 330 and DSP 340. FIG. 7B illustrates a bottom view 700B of the power supply board 700, which includes a third power supply section 730. The third power supply sub-module 730 can provide high voltage power supplies to transmitter module 320 and the multi-channel transducer. Separating the different power supplies into sub-modules 710-730 better isolates each power supply from switching noise in the other power supplies.

Figure 8A:
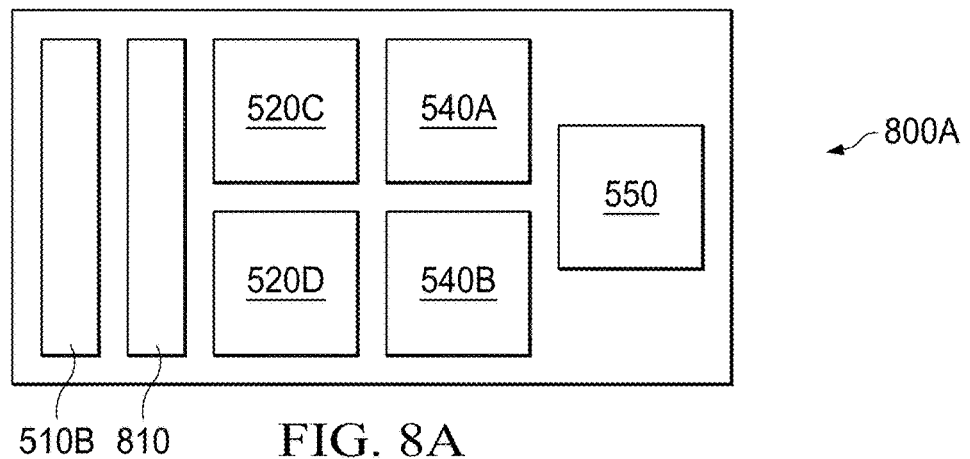
FIGS. 8A-C illustrate an example power supply system for the transmitter and receiver board shown in FIGS. 5A-C.
Figure 8B:
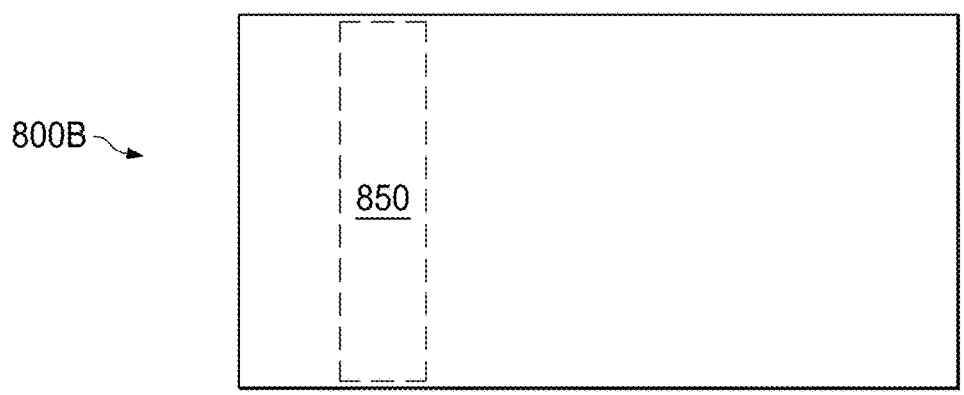
Figure 8C:
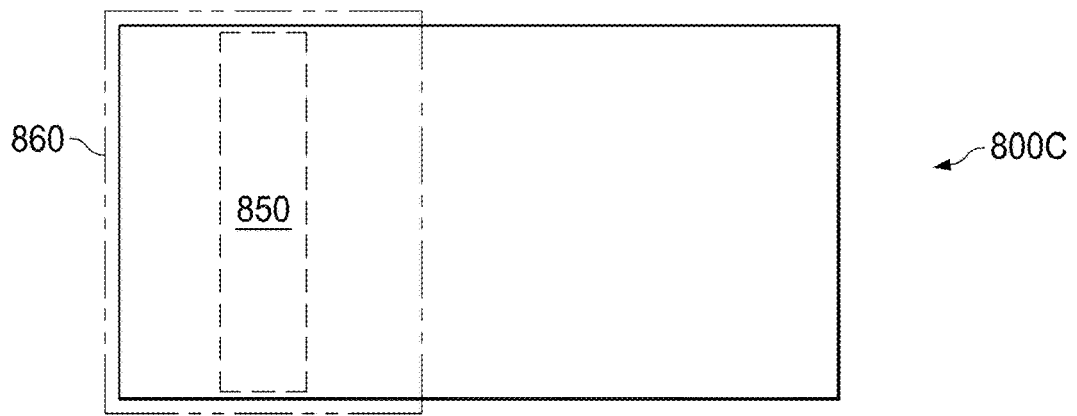

FIGS. 8A-C illustrate an example power supply system 800 for the Tx/Rx board 500 shown in FIGS. 5A-C. FIG. 8A illustrates a top view 800A of the board 500, showing a set 810 of high-voltage supply capacitors between the transducer connector 510 and transmitters 520C-D. The set 810 of high-voltage supply capacitors facilitates the sudden, short burst of high current needed to drive the transducers. For example, in some implementations each channel requires one ampere (A) of current for twenty nanoseconds (ns) to generate the high-voltage transmitted signal. To drive 64 channels, 64 A of current is needed, resulting in a very large current draw from the power supply. The set 810 of high-voltage supply capacitors has low inductance and reduces the drain on the power supply and the corresponding supply voltage ringing.

FIG. 8B illustrates a second layer 800B of the Rx/Tx board 500 with the high-voltage supply local plane 850 at a position underneath the set 810 of high-voltage supply capacitors on the top layer 800A of the Rx/Tx board 500. Placing the high-voltage supply local plane 850 in the second layer reduces the routing length between the power supply, the set 810 of high-voltage supply capacitors, and the high-voltage power supply pins in the transducer connector 510A and transmitters 520C-D. A shorter routing path results in lower impedance on the path, a higher current, and reduced supply voltage ringing.

FIG. 8C illustrates a bottom view 800C of Rx/Tx board 500 with a shield 860 covering the portion of the Rx/Tx board 500 with the high-voltage supply local plane 850 in the second layer. The supply inductors for Rx/Tx board 500 are incorporated into the bottom layer to avoid direct coupling, which can introduce electromagnetic interference (EMI) into the power supply board 700. A shield 860 is placed on the bottom of the Rx/Tx board 500 covering the high-voltage supply local plane 850 and the supply inductors, protecting the power supply board 700 from EMI.

Figure 9:
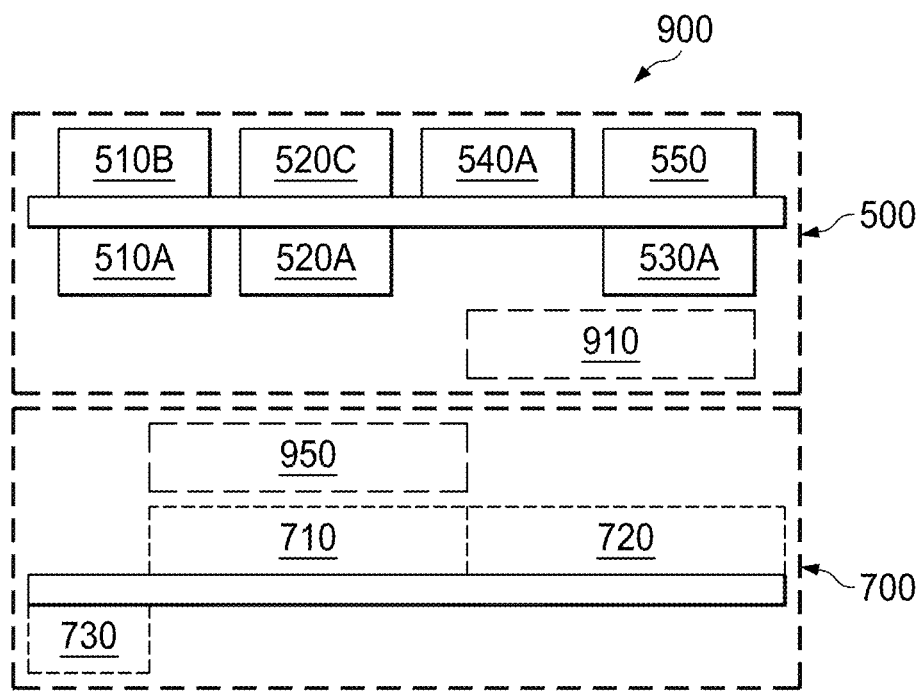
FIG. 9 illustrates an example shielding setup for the ultrasound system shown in FIGS. 3A-B.

FIG. 9 illustrates an example shielding setup 900 for the Rx/Tx board 500 shown in FIGS. 5A-C and power supply board 700 shown in FIGS. 7A-B. The Rx/Tx board 500 includes a first shield 910 placed underneath the power supply connector 530A on the bottom of the Rx/Tx board 500. The power supply board 700 includes a second shield 950 placed over the low voltage supply section 710 on the top of the power supply board 700. The Rx/Tx board 500 can also include an additional shield 860 as shown in FIG. 8C. The additional shield 860 can be made from copper foil, for example.

Figure 10:
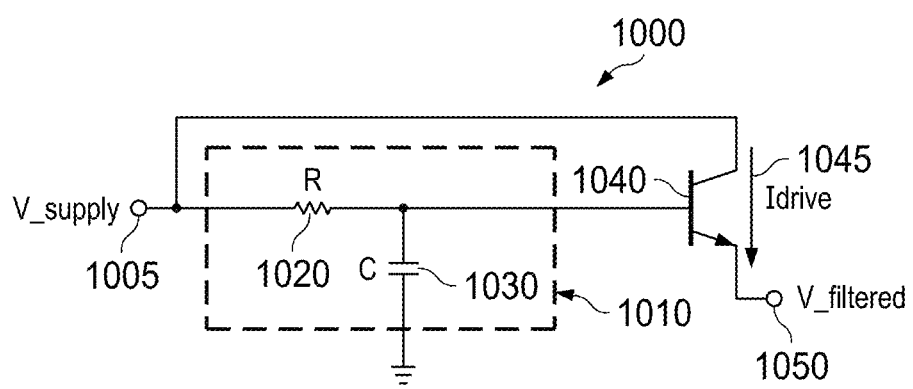
FIG. 10 illustrates an example filter for the power supply system shown in FIGS. 8A-C.

FIG. 10 illustrates an example filter 1000 for the power supply system 800 shown in FIGS. 8A-C. In some power supply systems, low-pass filters are used to decrease noise in the power supply, but the voltage drop across the low-pass filters decreases the available power and current. In power supply system 800, the power supply regulator is coupled directly to the transmitter devices 520A-D to increase the available power and current, but at the cost of increased noise in the power supply. The filter 1000 can be used to balance the need for high current with reduced noise.

The filter 1000 includes a low-pass filter 1010 and a transistor 1040, which is a bipolar junction transistor (BJT). The low-pass filter 1010 is made up of a resistor R 1020 and a capacitor C 1030. The resistor R 1020 is coupled between an input terminal configured to receive the supply voltage V_supply 1005 from the power supply regulator and the base terminal of the transistor 1040. The capacitor C 1030 is coupled to the base terminal of the transistor 1040 and the resistor R 1020, and further coupled to ground. The resistance R and the capacitance C can be chosen based on the desired filtering characteristics, such as less than 20 Herz.

The collector of transistor 1040 is also coupled to the input terminal configured to receive V_supply 1005 from the power supply regulator, and the emitter of transistor 1040 is coupled to an output terminal for providing the filtered supply voltage V_filtered 1050. The current Idrive 1045 through the collector and the emitter of transistor 1040 is the same as the current output from the power supply regulator, without a decrease due to a filter. The current through the low-pass filter 1010 and the base terminal of transistor 1040 is much lower than Idrive 1045. By routing Idrive 1045 through the collector and emitter of transistor 1040, the decrease in voltage and current across the low-pass filter 1010 no longer influences the drive current available to other devices. In addition, a large resistance R and a small capacitance C can be used to conserve area used by the filter 1000 while still reducing noise in the power supply.

Transistor 1040 is a BJT in this example. In other examples, transistor 1040 is an n-type or a p-type metal oxide semiconductor field-effect transistor (MOSFET). A MOSFET includes a gate terminal corresponding to the base terminal, and a drain terminal and a source terminal corresponding to the collector and emitter. The base terminal of the BJT and the gate terminal of the MOSFET are also called control inputs. The collector and emitter of the BJT and the drain and source terminals of the MOSFET are also called current terminals.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. An apparatus, comprising:
a transceiver (Tx/Rx) printed circuit board (PCB) with a top surface and a bottom surface, comprising:
a first transmitter device arranged on the bottom surface and comprising a number N of channels;
a second transmitter device arranged on the top surface over the first transmitter device and comprising the number N of channels, wherein one or more pins of the second transmitter device are shorted with one or more pins of the first transmitter device with the same function;
an analog front end (AFE) device comprising N input channels;
a digital signal processor (DSP) coupled to the AFE device; and
a power supply PCB comprising a power supply module configured to provide a plurality of supply voltages to the Tx/Rx PCB and the power supply PCB.

2. The apparatus of claim 1, wherein:
each particular channel of the N channels of the first transmitter device and the N channels of the second transmitter device comprises a unique transmit/receive (T/R) switch, and
the T/R switches are configured to select which of the N channels of the first transmitter device and which of the N channels of the second transmitter device to couple to the N input channels of the AFE device.

3. The apparatus of claim 1, wherein the DSP is configured to provide clocking signals to the first and second transmitter devices and to the AFE device, and wherein the DSP is further configured to transition the clocking signals to a tri-state mode of operation while the first and second transmitter devices are inactive.

4. The apparatus of claim 1, wherein the power supply module comprises:
a first section on a top surface of the power supply PCB configured to provide a first power supply to the AFE device and the DSP;
a second section on the top surface of the power supply PCB configured to provide a second power supply to a peripheral controller and an output interface affixed on the top surface of the power supply PCB; and
a third section on a bottom surface of the power supply PCB configured to provide a third power supply to the first and second transmitter devices.

5. The apparatus of claim 4, wherein the power supply PCB is arranged under the Tx/Rx PCB such that the third section is under the first and second transmitter devices.

6. The apparatus of claim 4, wherein the third section comprises a filter comprising:
a transistor comprising a control terminal, a first current terminal, and a second current terminal, wherein the first current terminal is configured to receive the third power supply, wherein the second current terminal is configured to provide a filtered, third power supply; and
a low-pass filter having an input configured to receive the third power supply and further having an output coupled to the control terminal.

7. The apparatus of claim 6, wherein the low-pass filter comprises:
a resistor having a first terminal configured to receive the third power supply and a second terminal coupled to the control terminal; and a capacitor having a first terminal coupled to the control terminal and the second terminal of the resistor and a second terminal coupled to ground.

8. The apparatus of claim 1, wherein the Tx/Rx PCB further comprises a set of high-voltage supply capacitors arranged on the top and bottom surfaces of the Tx/Rx PCB, and wherein a second layer of the Tx/Rx PCB comprises a high-voltage supply local plane arranged under the set of high-voltage supply capacitors.

9. The apparatus of claim 8, further comprising a shield between the Tx/Rx PCB and the power supply PCB configured to reduce electromagnetic interference from the Tx/Rx PCB at the power supply PCB.

10. A method, comprising:
obtaining a first printed circuit board (PCB) with a top surface and a bottom surface;
affixing a first transmitter (Tx) comprising a number N of channels to the bottom surface;
affixing a second Tx comprising the number N of channels to the top surface, wherein the second Tx is aligned on the top surface over the first Tx on the bottom surface;
shorting one or more pins of the first Tx with one or more pins of the second Tx having a same function;
affixing an analog front end (AFE) device comprising a number N of input channels to the top surface;
obtaining a second PCB; and
affixing a power supply module to the second PCB.

11. The method of claim 10, further comprising mapping the N channels of the first Tx to the N channels of the second Tx, such that a first channel of the first Tx corresponds to a channel of the second Tx at a same position in a top layer and a bottom layer of the first PCB.

12. The method of claim 10, further comprising affixing a set of high-voltage supply capacitors to the top and bottom surfaces of the first PCB over a high-voltage supply local plane in a second layer of the first PCB.

13. A device with a first printed circuit board (PCB) and a second PCB, comprising:
a first transmitter (Tx) device comprising a number N of channels and arranged on a bottom surface of the first PCB,
a second Tx device comprising the number N of channels and arranged on a top surface of the first PCB over the first Tx device, wherein:
each channel of the 2N channels of the first and second Tx devices comprises a respective receiver, transmitter, transmit/receive (T/R) switch, and output pin,
each output pin of the first Tx device is shorted with a corresponding output pin of the second Tx device,
each particular T/R switch is configured to disconnect the particular receiver from the particular transmitter while the corresponding channel is selected;
an analog front end (AFE) device comprising N input channels and arranged on the top surface of the first PCB, wherein the N input channels are coupled to the N shorted output pins of the first and second Tx devices;
a digital signal processor (DSP) coupled to the AFE device and arranged on the top surface of the first PCB;
a peripheral controller arranged on the second PCB and coupled to the DSP;
an output interface arranged on the second PCB and coupled to the peripheral controller; and
a power supply module configured to provide a plurality of supply voltages to the first and second PCBs.

14. The device of claim 13, wherein a pin of the second Tx device is shorted with a pin of the first Tx device with the same function.

15. The device of claim 13, wherein each T/R switch is further configured to disconnect the particular receiver from the particular transmitter during signal transmission.

16. The device of claim 13, wherein the power supply module comprises:
a first sub-module configured to provide a first supply voltage to the AFE device and the DSP;
a second sub-module configured to provide a second supply voltage to the peripheral controller and the output interface; and
a third sub-module configured to provide a third supply voltage to the first and second Tx devices.

17. The device of claim 16, wherein the second PCB is arranged under the first PCB such that the third sub-module is under the first and second Tx devices.

18. The device of claim 16, wherein the third sub-module comprises a filter, wherein the filter comprises:
a transistor comprising:
a control terminal,
a first current terminal configured to receive the third supply voltage, and
a second current terminal configured to provide a filtered, third supply voltage; and
a low-pass filter having an input configured to receive the third supply voltage and further having an output coupled to the control terminal.

19. The device of claim 18, wherein the low-pass filter comprises:
a resistor having a first terminal configured to receive the third supply voltage and a second terminal coupled to the control terminal; and
a capacitor having a first terminal coupled to the control terminal and the second terminal of the resistor and a second terminal coupled to ground.

20. The device of claim 13, wherein the first PCB further comprises a set of high-voltage supply capacitors arranged on the top and bottom surfaces of the first PCB, and wherein a second layer of the first PCB comprises a high-voltage supply local plane arranged under the set of high-voltage supply capacitors.

* * * * *